United States Patent
Bogner et al.

(10) Patent No.: US 7,581,860 B2
(45) Date of Patent: Sep. 1, 2009

(54) HEADLIGHT AND HEADLIGHT ELEMENT

(75) Inventors: Georg Bogner, Lappersdorf (DE); Stefan Grötsch, Lengfeld/Bad Abbach (DE); Joachim Reill, Zeitlarn (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 94 days.

(21) Appl. No.: 10/551,412

(22) PCT Filed: Mar. 24, 2004

(86) PCT No.: PCT/DE2004/000609

§ 371 (c)(1),
(2), (4) Date: Sep. 5, 2006

(87) PCT Pub. No.: WO2004/088200

PCT Pub. Date: Oct. 14, 2004

(65) Prior Publication Data

US 2007/0008734 A1    Jan. 11, 2007

(30) Foreign Application Priority Data

Mar. 31, 2003    (DE) .............................. 103 14 524

(51) Int. Cl.
*F21V 1/00*    (2006.01)
(52) U.S. Cl. .................... 362/509; 362/244; 362/309; 362/332; 362/545; 362/800
(58) Field of Classification Search ............... 362/244, 362/309, 332, 347, 509, 544, 545
See application file for complete search history.

(56) References Cited

U.S. PATENT DOCUMENTS 5,136,483 A    8/1992    Schoeniger et al.

(Continued)

FOREIGN PATENT DOCUMENTS

DE    696 05 265 T2    4/1997

(Continued)

OTHER PUBLICATIONS

I. Schnitzer, et al., "30% external quantum efficiency from surface textured, thin-film light-emitting diodes", Appl. Phys. Lett. vol. 63, No. 16, pp. 2174-2176, Oct. 18, 1993.

*Primary Examiner*—Sandra L O'Shea
*Assistant Examiner*—Meghan K Dunwiddie
(74) *Attorney, Agent, or Firm*—Cohen Pontani Lieberman & Pavane LLP

(57) ABSTRACT

A headlight having a multitude of headlight elements, which each have at least one semiconductor chip which emits electromagnetic radiation; a primary optics element, which reduces the divergence of the light which is incident through the light input; and at least one headlight element output, which emits a part of the headlight light from the headlight element. At least some of the headlight element outputs are arranged in at least two groups in such a way that the arrangement of at least one of the groups and/or at least overall arrangement of headlight element outputs of multiple groups corresponds essentially to a desired emission characteristic of the headlight, in that, in particular, it has a shape which corresponds essentially to the cross-sectional shape of a desired headlight beam, wherein the semiconductor chips which belong to the headlight element outputs of one group can each be operated independently of other semiconductor chips. A headlight element is disclosed which is suitable for a headlight such as this.

51 Claims, 6 Drawing Sheets

U.S. PATENT DOCUMENTS

| | | | |
|---|---|---|---|
| 5,174,649 A * | 12/1992 | Alston | 362/244 |
| 5,727,108 A | 3/1998 | Hed | |
| 5,841,596 A | 11/1998 | Perlo et al. | |
| 5,949,081 A | 9/1999 | Ashley et al. | |
| 6,406,172 B1 | 6/2002 | Harbers et al. | |
| 6,527,411 B1 | 3/2003 | Sayers | |
| 6,565,247 B2 | 5/2003 | Thominet | |
| 6,613,247 B1 | 9/2003 | Höhn et al. | |

FOREIGN PATENT DOCUMENTS

| | | |
|---|---|---|
| DE | 196 21 148 A | 12/1997 |
| DE | 696 20 206 T2 | 7/1998 |
| DE | 100 09 782 A1 | 9/2001 |
| EP | 0 523 927 A | 1/1993 |
| WO | WO 98/12757 | 3/1998 |

* cited by examiner

HEADLIGHT AND HEADLIGHT ELEMENT

RELATED APPLICATIONS

This is a U.S. national stage of application No. PCT/DE2004/000609, filed on 24 Mar. 2004.

This patent application claims the priority of German patent application no. 103 14 524.9, filed 31 Mar. 2003, the disclosure content of which is hereby incorporated by reference.

FIELD OF THE INVENTION

The invention relates to a headlight having a multitude of headlight elements, and to a headlight element therefore.

BACKGROUND OF THE INVENTION

A headlight which comprises headlight elements is described, for example, in U.S. Pat. No. 6,527,411 B1. Light output ends of the headlight element, or the headlight elements themselves, are in this case arranged in a circular shape, a central headlight element being surrounded by a multitude of further headlight elements. Light-emitting diodes (LEDs) can be used, in particular, for a headlight such as this, and, by way of example, have the advantage of long life, fast response and high electrical efficiency, which leads to reduced maintenance effort and reduced energy consumption.

However, because of its circular shape, a headlight as described in U.S. Pat. No. 6,527,411 B1 cannot be used, or can be used only to a restricted extent, for many applications in which the headlight is required to have a defined emission characteristic. One example of this is a motor vehicle headlight for which the applicable standards (for example ECE in Germany) stipulate an emission characteristic with a well-defined geometry of a light beam, and with abrupt light/dark transitions. Furthermore, there are applications in which it is necessary or advantageous for a headlight to have a variable emission characteristic.

SUMMARY OF THE INVENTION

One object of the present invention is to provide a headlight which, while being of simple design, allows a multitude of different emission characteristics and variable emission characteristics.

A further object of the present invention is to develop a headlight element which is particularly suitable for a headlight such as this.

This and other objects are attained in accordance with one aspect of the present invention directed to a headlight having a multitude of headlight elements, which each have at least one semiconductor chip which emits electromagnetic radiation and has a chip output surface through which electromagnetic radiation is emitted, a primary optics element, which has a light input and a light output and which reduces the divergence of the light which is incident through the light input, with the light being at least part of the electromagnetic radiation and/or at least part of a secondary radiation which is produced from the electromagnetic radiation emitted from the semiconductor chip, and at least one headlight element output, which emits a part of the headlight light from the headlight element. At least some of the headlight element outputs are arranged in at least two groups in such a way that the arrangement of at least one of the groups and/or at least one overall arrangement of headlight element outputs of multiple groups corresponds essentially to a desired emission characteristic of the headlight, in that, in particular, it has a shape which corresponds essentially to the cross-sectional shape of a desired headlight beam, wherein the semiconductor chips which belong to the headlight element outputs of one group can each be operated independently of other semiconductor chips.

In this case and in the following text the expression "a headlight beam" means a volume of any desired shape which is illuminated by the light from the headlight, excluding areas in which the brightness is more than one order of magnitude less than the maximum brightness at the same distance from the headlight. The expression "an emission characteristic" should be understood as meaning one or more characteristics of the headlight beam, such as the light intensity at different spatial angles, the light/dark transitions, or a cross-sectional shape. The expression "cross-sectional shape" means the shape of a cross section of the headlight beam on a plane at right angles to the main emission direction of the headlight.

With a headlight such as this, a multitude of different emission characteristics can be achieved just by the geometric arrangement of the headlight element outputs. Furthermore, a headlight is provided in simple manner, whose emission characteristic can be varied by switching on and off the semiconductor chips which belong to the headlight element outputs of different groups.

In a headlight element according to the invention, the primary optics element is in each case an optical concentrator. In this case, the light input is the actual concentrator output, so that light passes through this in the opposite direction compared with the normal use of a concentrator for focusing, and is thus not concentrated, but leaves the concentrator through the light output with reduced divergence.

In one particularly preferred embodiment, the primary optics element is a CPC, CEC or CHC-like concentrator, and this is what is meant in this case and in the following text by a concentrator, whose reflective side walls are at least partially and/or at least substantially in the form of a compound parabolic concentrator (CPC), a compound elliptical concentrator (CEC) and/or a compound hyperbolic concentrator (CHC).

As an alternative to the CPC, CEC or CHC-like concentrator, the concentrator preferably has side walls which connect the light input to the light output, along which direct connecting lines run, essentially in straight lines, between the light input and the light output. Instead of side walls which are curved by paraboloids, ellipsoids or hyperboloids, it is advantageous for the side walls to run essentially linearly, so that the primary optics element has the basic shape, for example, of a truncated pyramid or a truncated cone.

Primary optics elements and headlight elements designed in this way allow the divergence of light to be reduced efficiently, thus making it possible to produce a headlight with excellent brightness and a well-defined emission characteristic.

The embodiment and advantages of primary optics elements as described above and in the following text relate not only to the headlight according to the invention but also to the headlight element according to the invention, to the extent that they apply to it.

Particularly advantageously, the beam angle of a light beam which is emitted from the light output of the primary optics element is between 0 and 60°, preferably between 0 and 40°, particularly preferably between 0 and 20°, with the limits in each case being included. Analogously to the headlight, the light beam in this case and in the following text means volume of any desired shape which is illuminated by the light that is emitted from the light output of the primary optics element, excluding areas in which the brightness is more than one order of magnitude less than the maximum brightness at the same distance from the light output. In this sense, a light beam does not relate to the shape of a beam in the mathematical sense, and can accordingly have more than one beam angle. If this is the case, then the above statements relate to the maximum beam angle.

Since the divergence of light is in each case limited by the primary optics element to such an extent, it is possible to achieve a higher light intensity per headlight element. Furthermore, this results in the headlight having a greater number of possible emission characteristics which can be achieved by the arrangement of the headlight element outputs, since the light beams which are emitted from the headlight element overlap to a lesser extent with the same arrangement and, by way of example, it is possible to achieve better resolution with regard to the geometry of the light beam that is produced by the headlight.

In order to achieve a light beam emitted from the primary optics element with such a small beam angle, the light output of the primary optics element particularly advantageously has a light input surface or a light input opening whose size is less than or equal to twice the chip output area. The size of the light input surface or of the light input opening is preferably at most 1.5 times as large, in particular at most 1.1 times or 1.05 times, as large as the chip output area.

The size of the light input surface or of the light input opening is preferably larger than or not significantly less than the chip output area.

The light input of the primary optics element created in this way is suitable not only for major reduction in the divergence of a light beam, but also allows significant miniaturization of the primary optics element, and thus production of a compact headlight with a high emitted light intensity.

At least some of the headlight element outputs of at least one group are preferably densely packed, particularly preferably being arranged without any gaps. This makes it possible to achieve a high light intensity and better homogeneity of a headlight beam.

The semiconductor chips and/or the headlight element outputs are at least partially or at least in subgroups advantageously arranged like a matrix, that is to say regularly in rows and columns.

In one particularly preferred embodiment, the headlight is intended for use in a motor vehicle. In this case, the arrangement of at least a first group of headlight element outputs and/or multiple first groups together essentially correspond to the emission characteristic of a lower beam headlamp, in particular to the cross-sectional shape of the light beam of a lower beam headlamp. The arrangement of at least one second group and/or multiple second groups together is such that, together with the arrangement of the first group or of multiple first groups, it or they together or alone correspond or corresponds essentially to the emission characteristic of a upper beam headlamp, in particular to the cross-sectional shape of the light beam of a upper beam headlamp.

A motor vehicle headlight such as this can in each case easily be adapted to the required standards (for example ECE in Germany) and, furthermore, offers the capability to produce a light beam which can be varied by switching semiconductor chips on and off for a lower beam headlamp and/or upper beam headlamp.

In a further particularly preferred embodiment, the latter is made use of to produce a "steering" headlight. In this case, the headlight has multiple first and second groups, wherein only semiconductor chips in some of the groups are in each case operated as a function of the steering angle of the motor vehicle when using the headlight elements in the first and/or the second groups, in such a way that the light beam which is emitted from the headlight at least partially follows the direction of travel of the motor vehicle.

The light output of the corresponding primary optics element in one embodiment is in each case advantageously the headlight element output.

Each primary optics element is preferably followed by an optical waveguide, preferably a glass fiber or a bundle with multiple glass fibers, with a light input surface and a light output surface, in the emission direction of the primary optics, into which at least the majority of the light which is emitted from the light output of the respective primary optics element is passed through the light input surface.

The light output surface of the optical waveguide is in each case particularly advantageously the headlight element output. This allows the headlight element outputs to be arranged in a simple manner independently of the arrangement of the semiconductor chips and/or of the primary optics elements, thus providing further flexibility for the design of the headlight. For example, the semiconductor chips can be arranged further apart from one another in order to better dissipate the heat from a semiconductor chip during its operation. The headlight element outputs may in this case nevertheless be arranged densely packed.

The optical waveguide is expediently arranged with the light input surface in each case directly adjacent to the light output of the corresponding primary optics element.

The optical waveguide is in each case advantageously connected to the corresponding primary optics element by means of a plug connector, and/or the optical waveguide is in each case fitted with the light input surface by means of an adhesive to the light output of the corresponding primary optics element, and is connected to the primary optics element. The primary optics element and the waveguide are thus fixed with respect to one another, ensuring that as much light as possible emerges from the light output into the waveguide.

The optical waveguide is in each case particularly advantageously connected by means of a plug connector to the corresponding primary optics element and the multitude of connecting plugs are connected to one another, or are formed integrally.

It is likewise advantageous for the optical waveguide to in each case be connected by means of the connecting plug to the corresponding primary optics element, and for the connecting plug to be formed integrally with the primary optics element. This allows them to be produced jointly, so that they need no longer be connected to one another, or installed separately.

The optical waveguide is preferably formed integrally with the corresponding primary optics element. Once again, this allows simplified production and/or simplified installation. Furthermore, this results in the light transfer from the primary optics element to the waveguide being further optimized.

In one preferred embodiment of the headlight, the primary optics element is in each case an optical concentrator, particularly preferably a CPC, CEC or CHC-like optical concentrator. In this case, the light input is the actual concentrator output, so that light passes through this in the opposite direction compared with the normal use of a concentrator, and is thus not concentrated, but leaves the concentrator through the light output with reduced divergence.

The concentrator preferably has a cross-sectional surface in the form of a regular polygon, particularly preferably a square cross-sectional surface, in a region on the side of the light input. It preferably likewise has a cross-sectional surface in the form of a regular polygon preferably a triangular, quadrilateral, hexagonal or octagonal cross-sectional surface, in a region on the side of the light output. The cross-sectional surface merges from one shape to the other shape between these areas. The light input of the concentrator can thus be matched to the conventional shape of semiconductor chips, and the light output can, by way of example, be designed such that the light outputs of multiple primary optics elements can be arranged regularly and without any gaps, which is particularly advantageous when the light output is the headlight element output.

In one advantageous embodiment, the concentrator has a base body which defines a cavity, whose internal wall is reflective for the light emitted from the semiconductor chip and/or whose internal wall is essentially provided with a layer or layer sequence, preferably with a metallic layer, which is reflective for the light emitted from the semiconductor chip.

Alternatively, the concentrator is advantageously a dielectric concentrator whose base body is a solid body which is composed of a dielectric material with a suitable refractive index such that light which is injected via the light input is reflected in this by total internal reflection on the side boundary surface of the solid body, which connects the light input to the light output, to the external atmosphere. This has the advantage that the reflections in the concentrator mean that there are virtually no light losses.

The dielectric concentrator particularly advantageously has a boundary surface which is curved like a lens as the light output, which, for example, may be spherically or aspherically curved. This makes it possible to achieve a further reduction in the divergence of the light beam. The light output is preferably curved in the manner of an aspherical lens, thus making it possible, for example, to take account of the size of the chip output surface. Spherical lenses are optimum for point light sources and may have considerably poorer characteristics, with regard to the reduction in the divergence of a light beam, for non-point light sources.

In a further embodiment, the dielectric concentrator is advantageously provided at least partly with a layer or layer sequence, preferably with a metallic layer, which is reflective for the light which is emitted from the respective semiconductor chip. This may be advantageous, for example, when the semiconductor chip is included in the material of the concentrator in order to prevent the radiation, which does not comply with the condition of total internal reflection initially, being emitted from the concentrator at the side.

The concentrator is preferably arranged downstream from the semiconductor chip in its main emission direction, with a gap between the chip output surface and the light input of the concentrator. This gap is advantageously substantially free of solid or viscous materials.

This means that, in particular, beams which are emitted at a particularly large angle with respect to the main emission direction of the semiconductor chip and which would excessively widen the light beam of the light output do not strike the light input but run passed it at the side. In the case of a dielectric concentrator, the gap leads to a greater proportion of the light rays being reflected on the boundary surface of the light input the larger their incidence angle. The highly divergent component of the light which reaches the concentrator is thus in each case attenuated.

Especially in this context, it is particularly advantageous for the headlight element to have one or more reflector elements, which are arranged in such a way and/or are of such a shape that some of the light rays which do not enter the concentrator directly from the semiconductor chip are subject to multiple reflections on it, and are passed to the light input of the concentrator at a smaller angle with respect to the main emission direction of the semiconductor chip. This leads to an increase in the intensity of the light reaching the concentrator.

The base body of the concentrator is expediently composed of a transparent glass, a transparent crystal or a transparent plastic, and is preferably manufactured using an injection-molding and/or transfer-molding process.

The material of the base body is particularly preferably resistant to radiation emitted from the semiconductor chip, in particular to electromagnetic radiation from the blue or UV spectral range. For this purpose, the material has, for example, silicone, or is composed of it.

In one advantageous embodiment, the semiconductor chip is a diode which emits electromagnetic radiation, preferably a diode which emits electromagnetic radiation and has an at least approximately Lambert emission characteristic, particularly preferably being a thin-film light-emitting diode chip.

A thin-film light-emitting diode chip is distinguished in particular by the following characteristic features:

a reflective layer is applied to or is formed on a first main surface, facing towards a mount element, of a radiation-producing epitaxial layer sequence, and reflects back at least a portion of the electromagnetic radiation produced into the epitaxial layer sequence;

the epitaxial layer sequence has a thickness in the region of 20 μm or less, in particular in the region of 10 μm; and the epitaxial layer sequence contains at least one semiconductor layer with at least one surface which has a mixing structure which, in the ideal case, leads to an approximately ergodic distribution of the light in the epitaxial layer sequence, that is to say it has a scattering behavior which is as ergodically stochastic as possible.

One fundamental principle of a thin-film light-emitting diode chip is described, by way of example, in I. Schnitzer et al., Appl. Phys. Lett. 63 (16), Oct. 18, 1993, 2174-2176. The disclosure content of which is hereby incorporated by reference.

A thin-film light-emitting diode chip is, to a good approximation, a Lambert surface emitter and is thus particularly highly suitable for use in a headlight.

In one preferred embodiment of the headlight, the diode is followed in the emission direction by a luminescence conversion material, which converts the wavelength of at least a portion of the electromagnetic radiation emitted from the thin-film light-emitting diode, that is to say which absorbs this radiation and then emits radiation at a different wavelength. The resultant radiation is obtained by mixing the radiation whose wavelength has been converted with the radiation emitted from the diode, so that, in particular, this also makes it possible to produce white light, as is required for many headlight applications.

The wavelength of the radiation which is emitted from the thin-film light-emitting diode chip can also be converted essentially completely by the luminescence conversion material, for example, in order to convert radiation that is not visible to visible light. When using at least two different luminescent materials it is also possible, in particular, to produce white light in this way. Such organic or inorganic luminescent material particles are described, for example, in USP 6.066.861, the content of which is hereby incorporated by reference.

The headlight elements are advantageously followed in their main emission direction by secondary optics, by means of which the light emitted from them experiences a further reduction in the divergence, and/or is mixed. These secondary optics are expediently in the form of a condenser lens in one further embodiment.

It is particularly advantageous for the primary optics elements of multiple headlight elements to be formed integrally with one another. This makes it possible not only to significantly simplify the production of the primary optics element but also to significantly simplify their installation in a headlight, which can lead, for example, to reduced production costs.

In one preferred embodiment of the headlight, the semiconductor chips are arranged on in each case one mount, on which they are each surrounded by a frame to or in which the primary optics element is fitted and is held by it, and/or by means of which it is adjusted relative to the chip output surface.

At least some of the mounts and/or in each case the mount and the frame are advantageously formed integrally with one another.

It is particularly advantageous for the mounts for multiple semiconductor diodes to be arranged in at least one strip alongside one another, like a row. This makes it possible to better dissipate the heat that is created during operation of the semiconductor chips.

In a further embodiment of the headlight, the inner surface of the frame and/or the free surfaces of that surface of the mount which faces the emission direction of the headlight are/is reflective for light which is emitted from the respective semiconductor chip. Additionally or alternatively, it or they is or are provided, at least partly, with a layer or layer sequence, preferably with a metallic layer, which is reflective for the light which is emitted from the respective semiconductor chip.

DETAILED DESCRIPTION OF THE DRAWINGS

Identical components or components having the same effect are in each case provided with the same reference symbols in the exemplary embodiments and figures.

Figure 1:
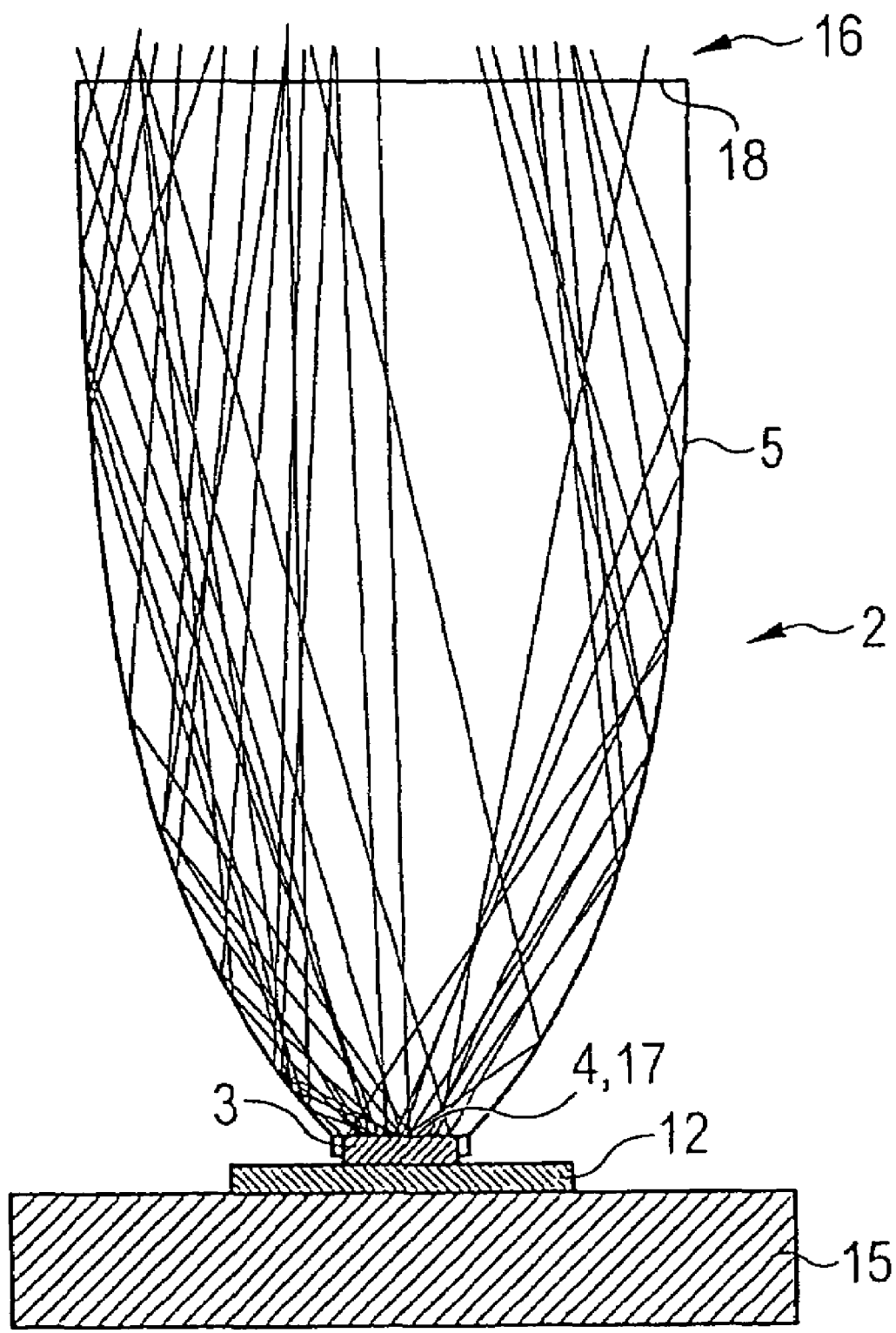
FIG. 1 shows a schematic section view of one exemplary embodiment of a headlight element.

The headlight element 2 illustrated in FIG. 1 has a semiconductor chip 3 which is fitted on a mount 12. The mount 12 is in turn fitted on a second mount 15, which acts as a heat sink for the heat that is produced by the semiconductor chip 3 during its operation.

The semiconductor chip is, for example, a thin-film light-emitting diode chip, which can be obtained as described above . Furthermore, the epitaxial layer sequence may be based on at least one material in the system $In_xAl_yGa_{1-x-y}N$ or $In_xGa_yAl_{1-x-y}P$ where $0 \leq x \leq 1, 0 \leq y \leq 1$ and $x+y \leq 1$. This has a chip output surface 4, which is directly adjacent to the light input 17 of the primary optics element.

By way of example, a luminescence conversion material can be applied to the chip output surface 4 and, by way of example, has one or more types of fluorescent particles based on YAG:Ce. The luminescence conversion material makes it possible to produce, in particular, white light either by substantially complete conversion of primary radiation from the semiconductor chip or by deliberate partial conversion and mixing of primary radiation and converted radiation of visible light of a desired color type on the CIE color chart.

The primary optics element 5 is a three-dimensional CPC-like concentrator, whose light input 17 and light output 18 are circular, with the light output 18 at the same time forming the headlight element output. Light in the form of visible electromagnetic radiation passes through the light input 17 from the semiconductor chip 3 into the primary optics element 5. The radiation is reflected on the inner walls, which connect the light input 17 to the light output 18, in such a way that the divergence of the light is considerably reduced (indicated by the lines 16). The light beam which is emitted from the light output 18 has, for example, a beam angle of less than 30°, for example about 9°, while in contrast the semiconductor chip has an approximately Lambert emission characteristic.

The base body of the primary optics element 5 acts like a cavity whose inner wall is provided with a material which is reflective for the light which is emitted from the semiconductor chip, for example being provided with a metallic layer which is composed, for example, of aluminum. In this case, the wavelength of the light is partially or entirely converted by means of a luminescence conversion material which comprises at least one phosphor. The material from which the base body is essentially manufactured may be a plastic such as polycarbonate and, by way of example, the base body may be produced from a material such as this by means of injection molding.

Figure 2:
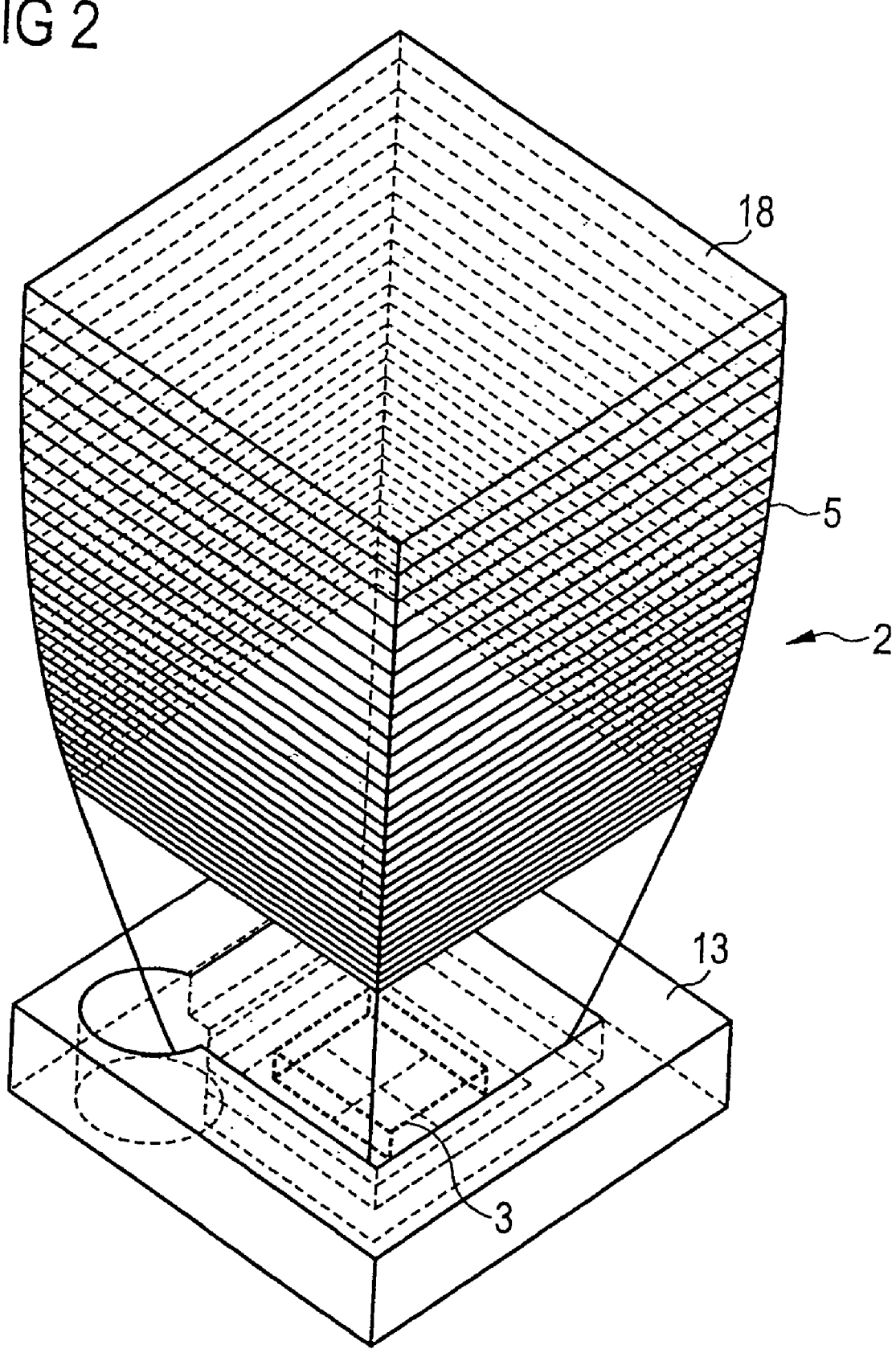
FIG. 2 shows a schematic three-dimensional view of a second exemplary embodiment of a headlight element.

As is shown in FIG. 2, the semiconductor chip 3 may additionally be surrounded by a frame 13, by means of which the primary optics element 5 can be held and/or can be adjusted relative to the semiconductor chip 3. The frame is, for example, partially filled with an encapsulation compound, which may be composed of one or more types of luminescent materials.

In the exemplary embodiment shown in FIG. 2, the headlight element 2, in contrast to the exemplary embodiment explained with reference to FIG. 1, has a primary optics element 5 in the form of a CPC-like concentrator, whose cross section has a square shape at right angles to its main emission direction, so that, in particular, its light input (not shown) and light output 18 are also square. The shape of the primary optics element 5 is thus matched to the shape of the chip output surface of the semiconductor chip 3. Furthermore, this has the advantage that the light outputs and the headlight element outputs of multiple such headlight elements 2 can be arranged on a surface of any desired size without any gaps.

Figure 3A:
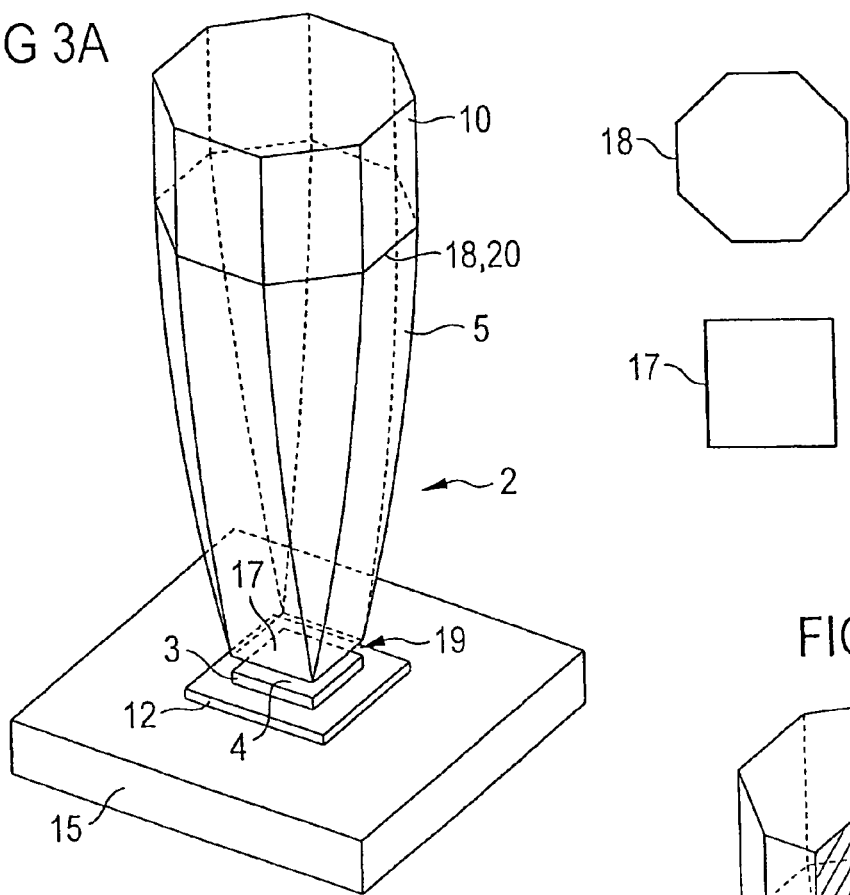
FIG. 3a shows a schematic three-dimensional view of a third exemplary embodiment of a headlight element.
Figure 3B:
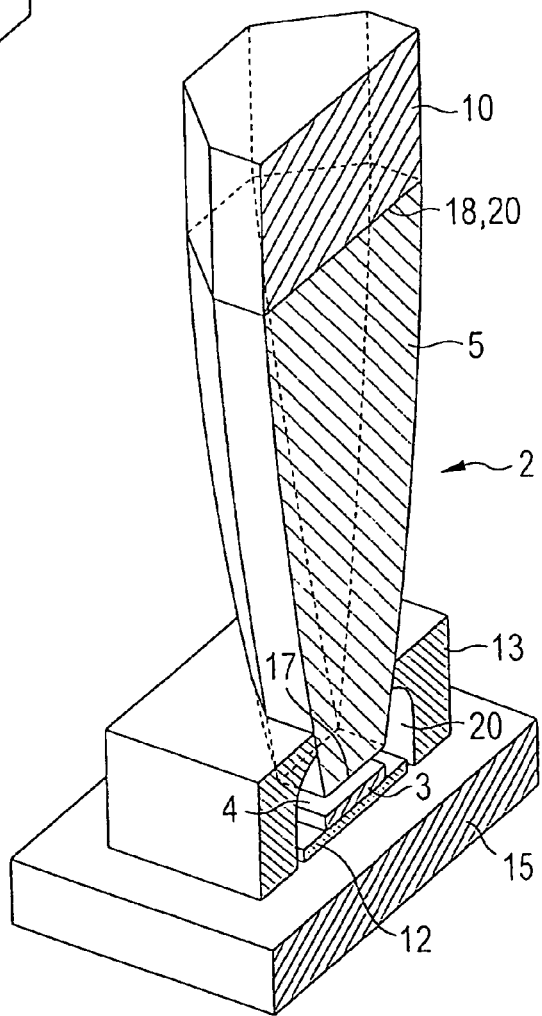
FIG. 3b shows a schematic three-dimensional section view of the headlight element shown in FIG. 3a, FIG. 4 shows a schematic plan view of one exemplary embodiment of a headlight.

A further exemplary embodiment of a headlight element is illustrated in FIGS. 3a and 3b. In this case, the primary optics element 5 is a dielectric CPC-like concentrator, whose base body is composed, for example, of a transparent plastic.

The light input 17 has a square shape, while the light output 18 is in the form of a regular octagon (in each case shown in the form of a plan view on the right, alongside the headlight element 2). The cross-sectional shape of the primary optics element 5 merges from one form to the other in between. The light output is matched by virtue of its shape to the light input surface 20 of an optical waveguide 10 which, with this, is directly adjacent to the light output 18. The optical waveguide 10 is, for example, a glass fiber but, as an alternative to the example shown in FIGS. 3a and 3b, may also have multiple thin glass fibers. The light output surface of the waveguide 10 in this case forms the headlight element output (not shown).

The optical waveguide 10 is, for example, connected by means of a suitable adhesive to the light output 18 of the primary optics element 5. Alternatively or additionally, the waveguide 10 and the primary optics element 5 may also be connected to one another by means of a connecting plug. In this case, the primary optics element 5 may also be formed integrally with the plug and, for example, may be produced from a transparent plastic by means of injection molding.

There is an air gap 19 between the chip output surface 4 of the semiconductor chip 3 and the light input 17. This attenuates the highly divergent component of the light entering the primary optics element 5, as described in the general part of the description.

In addition, FIG. 3b shows a frame 13 for the headlight element. The inner wall 20 of this frame 13 and the mount 15 are manufactured from a reflective material, so that some of the light beams which do not enter the primary optics element directly are subject to multiple reflections on it in such a way that they are deflected at a small angle with respect to the main emission direction of the semiconductor chip 3 onto the light input 17 of the primary optics element. The frame 13 may in this case be formed integrally with the mount 12.

Alternatively, the semiconductor chip 3 may also be embedded in the material of the primary optics element 5, or its chip output surface may be directly adjacent to the light input 17.

At least a part of the side surface of the base body of the primary optics element 5 which connects the light input 17 to the light output 18 can be provided with a reflective layer (for example aluminum) in such a way that light beams which are injected into the light input 17 and do not satisfy the condition of total internal reflection on the side surface are nevertheless reflected on it. This may be expedient, particularly in the case of that part of the side surface which is adjacent to the light input 17.

Figure 6:
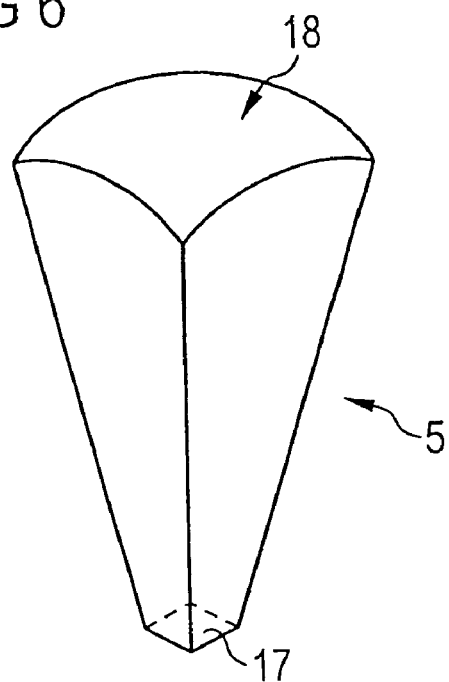
FIG. 6 shows a schematic three-dimensional view of one exemplary embodiment of a primary optics element.

In contrast to the primary optics elements illustrated in FIGS. 1 to 3b, the primary optics element 5 illustrated in FIG. 6 has side walls which run on straight lines from the light input 17 to the light output 18. The primary optics element 5 is a dielectric concentrator with a basic shape in the form of a truncated cone, with the light output 18 not being planar but being curved outwards like an aspherical lens. Compared with spherical curvature, the curvature decreases, for example, as the distance from the optical axis of the primary optics element increases, in order to take account of the fact that the light beam whose divergence is intended to be reduced by the primary optics element is not a point light source, but is a light source with a specific extent.

A primary optics element as illustrated in FIG. 6 has the advantage over the primary optics elements 5 illustrated in FIGS. 1 to 3b that it makes it possible to achieve a comparable reduction in the divergence of a light beam while at the same time significantly reducing the physical height of the primary optics element 5. A further advantage of the primary optics element illustrated in FIG. 6 is that, because it has straight side surfaces, it can be produced more easily by means of a molding method, such as injection molding or transfer molding.

The light input has, for example, a light input surface which is approximately of the same size as a chip output surface of a semiconductor chip which can be used with the primary optics element. This makes it possible to make particularly good use of the characteristics of the primary optics element in terms of reducing the divergence. The light input area is particularly preferably at most 1.5 times as large as the chip output area.

It is also possible to use the primary optics element, for example, with a semiconductor chip whose chip output surface is larger than the light input surface, although this can lead to somewhat reduced effectiveness, with regard to the emitted light strength and light intensity. In an example, simulations have shown that approximately 10% less light intensity can be emitted into a spatial angle of 15° when the chip output area is somewhat larger, than in the case of a chip output area which is somewhat smaller than the light input area.

Figure 7:
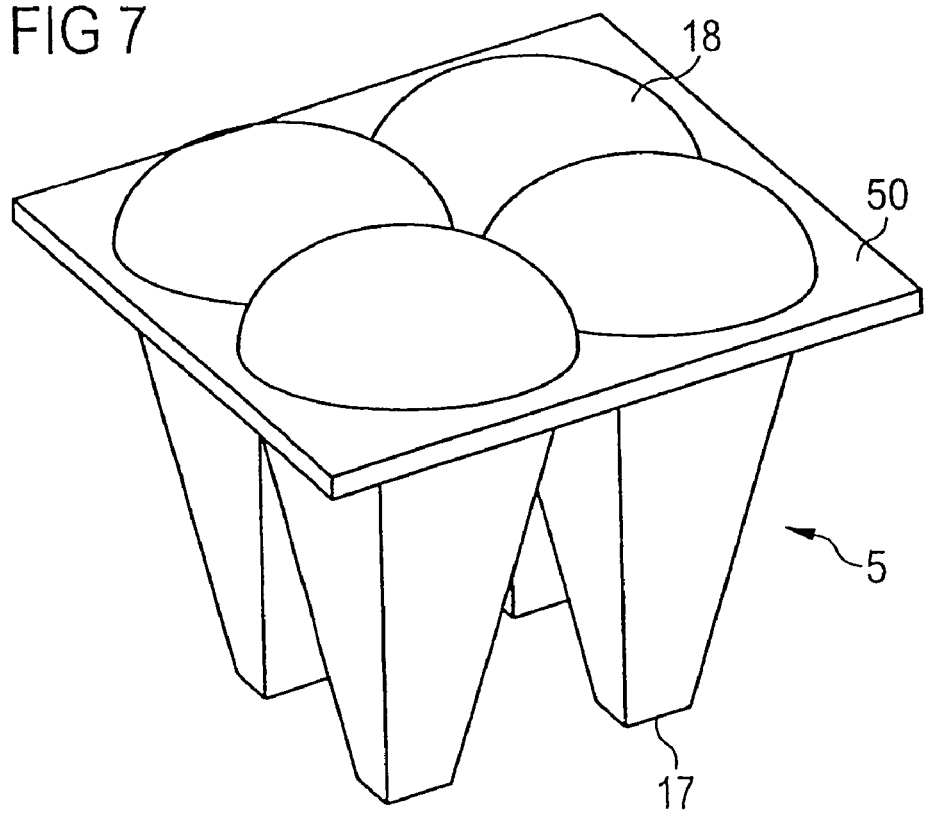
FIG. 7 shows a schematic three-dimensional view of one exemplary embodiment of primary optics elements which are formed integrally with one another.

A molding method, in particular, can be used to form multiple primary optics elements integrally with one another, as is illustrated in the form of an example in FIG. 7. The primary optics elements 5 in this exemplary embodiment are connected to one another by means of a mounting plate 50, with the mounting plate being arranged close to the light output 18, so that parts of the primary optics elements 5 which are like truncated pyramids originate from one face of the mounting plate 50 and lens-like elements are formed on the other face, whose outer surface in each case forms the light output 18 of the primary optics elements 5.

As an alternative to the exemplary embodiments of primary optics elements 5 as explained with reference to FIGS. 6 and 7, these may, for example, also have a basic shape like a truncated cone or a basic shape with a rectangular cross section, instead of a basic shape like a pyramid. It is likewise feasible for the square cross section of the primary optics elements in FIGS. 6 and 7 to merge towards the light output 18 into a cross-sectional shape which has more than four corners, analogously to the exemplary embodiment which has been described above with reference to FIGS. 3a and 3b.

It is also possible for the primary optics element to be designed in such a way that the divergence of electromagnetic radiation on different planes which run parallel to the main emission direction of the primary optics element is reduced to a different extent. For example, the emitted light beam comprises a beam angle of approximately 7° if measured in a first plane that extends parallel to a main emitting direction of the primary optics elements. If, however, the beam angle is measured along a second plane which extends parallel to a main emitting direction of the primary optics element and which extends diagonally to the plane mentioned before, its value is approximately 10°. This means that the light beam has an elongated cross-sectional area.

It is likewise possible for CPC, CEC or CHC-like dielectric concentrators to likewise have a light output which is curved like a lens, in order to further reduce the divergence of a light beam. As an alternative to a dielectric concentrator, the concentrator may also be formed from a hollow body with reflective inner walls, whose light output is followed by a lens in the emission direction of the concentrator. By way of example, the lens is fitted to the light output.

Figure 4:
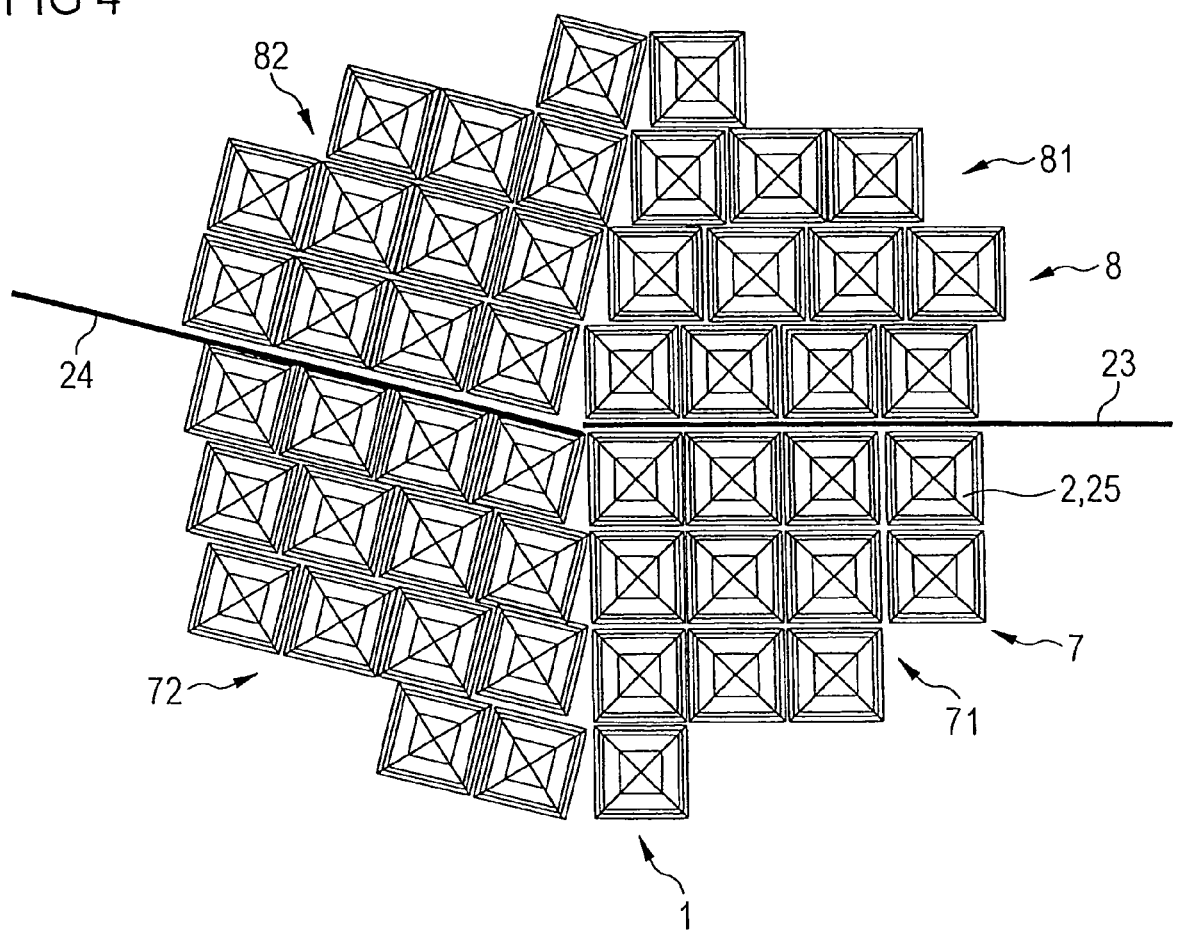

FIG. 4 shows the plan view of one exemplary embodiment of a headlight in the form of a motor vehicle headlight 1. This comprises a multitude of headlight elements 2, whose headlight element outputs 25 are arranged in groups like a matrix, and substantially without any gaps. The headlight elements 2 may, for example, be designed in the same way as described in one or more of the exemplary embodiments that have been explained with reference to FIGS. 1 to 3b. Thus, in particular, the headlight element outputs may either be light outputs of the primary optics or light output surfaces of optical waveguides.

Irrespective of the fact that the headlight element outputs 25 in FIG. 4 have a square shape, they may have any desired shape, and in particular may also be triangular, hexagonal or octagonal, or else round.

When the headlight elements have optical waveguides, the respective semiconductor chips can be arranged differently than in the case of the headlight element outputs, for example alongside one another in a single row. In the situation where the waveguides are connected by means of connecting plugs to the primary optics element, all of the connecting plugs may be formed integrally together, or some of them may in each case be formed integrally.

The headlight element outputs 25 are subdivided into two groups 7, 8, whose separating line is indicated in FIG. 4 by the two lines 23, 24, with the lower group 7 forming the headlight output for a lower beam headlamp, and the upper group 8 together with the lower group 7 forming that for a upper beam headlamp. The semiconductor chips of the headlight elements 2 which belong to the lower group 7 may be operated independently of other semiconductor chips. In order to produce a headlight beam with the emission characteristic of a upper beam headlamp, the semiconductor chips of the headlight elements which belong to the upper group 8 may be operated in addition to those in the lower group 7.

Both groups each have two subgroups 71, 72 and 81, 82, respectively, of which in each case one is arranged along one of the lines 23, 24, with the first line 24 being rotated through 15° with respect to the other line 23. This results in a headlight beam for the lower beam headlamp (groups 71, 72) which corresponds essentially to the German Standard ECE, on the basis of which this beam must have a horizontally running upper limit on the left-hand side in the emission direction of the headlight (which corresponds to the group 72), such that drivers of oncoming vehicles are not dazzled.

The right-hand side of the headlight beam (which corresponds to the group 71) in contrast has an upper limit which lies on a plane tilted through 15° with respect to the horizontal, such that that part of the road which is located on the right in the direction of travel, or the road edge, is illuminated better and in the direction of travel further by the headlight than the left-hand part.

When the upper beam headlamp is selected, those semiconductor chips which belong to the headlight element outputs that are located relatively high are switched on, so that the resultant headlight beam overall illuminates a more far-reaching part of the roadway, in particular in the direction of travel.

The arrangement of the groups and subgroups can easily be matched to the legal requirements in different countries.

The headlight element outputs may be followed by a condenser lens (not shown), in order to further reduce the divergence of the light from the headlight.

Figure 5:
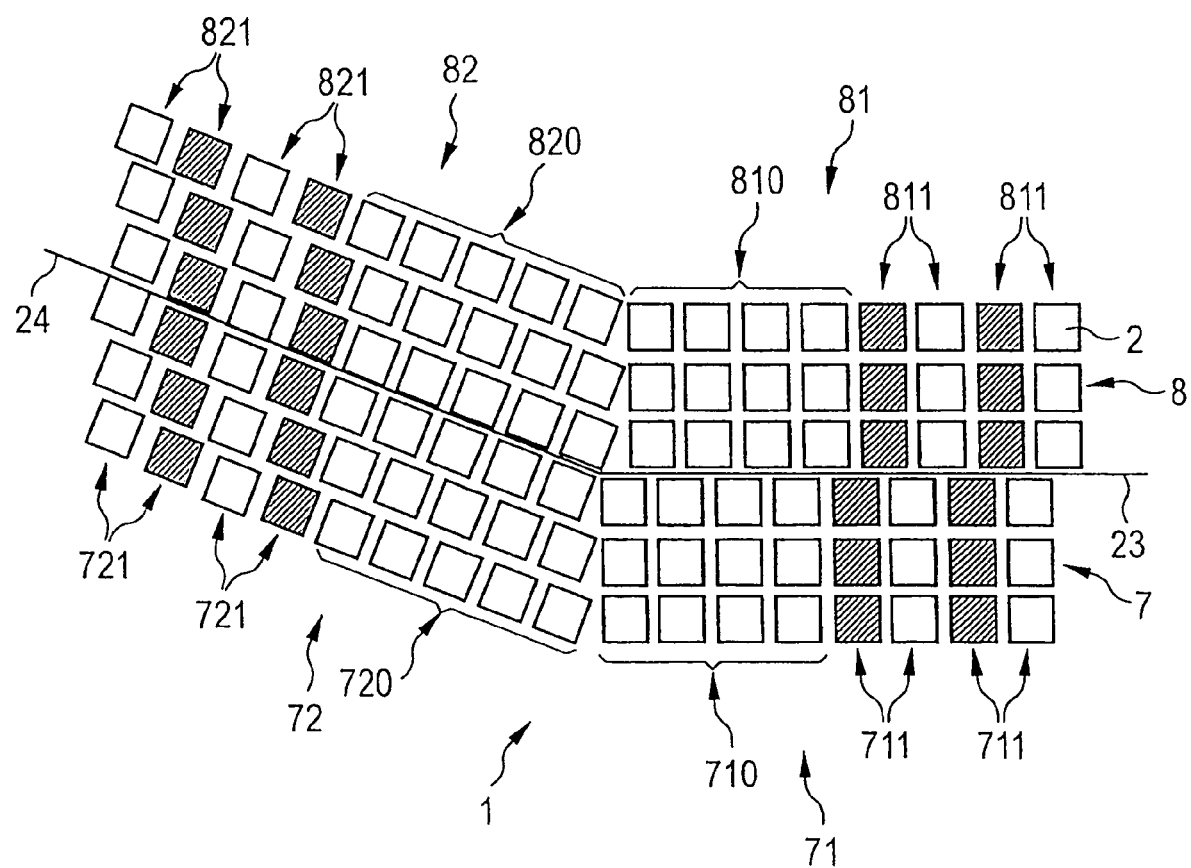
FIG. 5 shows a schematic plan view of a second exemplary embodiment of a headlight.

FIG. 5 shows a further exemplary embodiment of a headlight. This is likewise a motor vehicle headlight 1, whose headlight element outputs are arranged in accordance with the ECE Standard.

In contrast to the exemplary embodiment which has been explained with reference to FIG. 4, the headlight shown in FIG. 5 has peripheral groups of headlight element outputs 711, 811, 721, 821, whose corresponding semiconductor chips are in each case switched on or off in accordance with the steering angle of the vehicle, such that the light beam emitted from the headlight at least partially follows the direction of travel of the motor vehicle.

The central groups 710, 720, 810, 820 are switched on or off, for example manually by the driver, independently of the steering angle, as a function of whether the lower beam headlamp or upper beam headlamp has been selected.

When steering straight ahead with lower beam headlamp selected, for example the semiconductor chips in the central groups 710, 720 as well as in each case one of the peripheral groups 711 and 721 adjacent to them, may be selected. If the steering angle is changed in the direction of the peripheral groups 711 on the left in the direction of travel, then a further one of these groups, for example, is switched on, and the right-hand peripheral group 721, which is switched on until this point, is at least partially switched off for this purpose.

The above explanation of the invention on the basis of the exemplary embodiment should not, of course, be regarded as any restriction of the invention to these exemplary embodiments. Thus, for example, the invention is in no way restricted to motor vehicle headlights, but covers all conceivable types of headlight. The invention is particularly suitable for a projection light source, as well. In addition, in this case, semiconductor chips which can be operated independently of one another may be used, for example, for sequential projection of different projection images and/or different colors.

Furthermore, one headlight may also have multiple semiconductor chips per headlight element and/or semiconductor chips of different emission colors, for example red, green and blue. The headlight element outputs which are associated with the semiconductor chips that emit different colors may then, for example, be arranged such that they are mixed with one another, in such a way that the light from the different headlight element outputs is subsequently mixed, effectively producing white light.

Features which have been explained with reference to different exemplary embodiments can be combined with one another as required independently of the exemplary embodiment. The invention covers every new feature as well as every combination of features which, in particular, includes every combination of features in the patent claims, even if this feature or this combination itself is not explicitly stated in the patent claims or exemplary embodiments.

The invention claimed is:

1. A headlight having a multitude of headlight elements, wherein each of the headlight elements comprises:
   (i) at least one semiconductor chip which emits electromagnetic radiation and has a chip output surface through which electromagnetic radiation is emitted,
   (ii) a primary optics element, which has a light input and a light output and which reduces the divergence of the light which is incident through the light input, with the light being at least part of the electromagnetic radiation and/or at least part of a secondary radiation which is produced from the electromagnetic radiation emitted from said semiconductor chip, and
   (iii) at least one headlight element output, which emits a part of the headlight light from the headlight element; and wherein at least some of the headlight element outputs are arranged in at least two groups in such a way that
   (a) the arrangement of at least one of the groups and/or
   (b) at least one overall arrangement of headlight element outputs of multiple groups corresponds essentially to a desired emission characteristic of the headlight, in that, in particular, it has a shape which corresponds essentially to the cross-sectional shape of a desired headlight beam, wherein the semiconductor chips which belong to the headlight element outputs of one group can each be operated independently of other semiconductor chips; and wherein each of the semiconductor chips is integrated into the headlight without a housing.

2. The headlight as claimed in claim 1, wherein
a beam angle of a light beam which is emitted from the light output of the primary optics element is between 0 and 60°, preferably between 0 and 40°, particularly preferably between 0 and 20°, with the limits in each case being included.

3. The headlight as claimed in claim 1, wherein
at least parts of the headlight element outputs in at least one group are packed densely, and are preferably arranged without any gaps.

4. The headlight as claimed in claim 1, wherein
the semiconductor chips and/or the headlight element outputs are at least partially or at least in subgroups arranged like a matrix.

5. The headlight as claimed in claim 1, wherein
the headlight is intended for use in a motor vehicle, and in that the arrangement of at least one first group of headlight element outputs and/or of multiple first groups together corresponds essentially to an emission characteristic of a lower beam headlamp, in that, in particular, it corresponds essentially to the cross-sectional shape of a light beam of a lower beam headlamp, and in that at least one second group and/or multiple second groups is or are arranged together in such a way that, together with the arrangement of the first group or of multiple first groups it or they correspond together or on its or their own essentially to the emission characteristic of a upper beam headlamp, in that it corresponds in particular essentially to the cross-sectional shape of a light beam of a upper beam headlamp.

6. The headlight as claimed in claim 5, wherein
the headlight has multiple first and second groups, wherein only semiconductor chips in some of the groups are in each case operated as a function of the steering angle of the motor vehicle when using the headlight elements in the first and/or the second groups, in such a way that the light beam which is emitted from the headlight at least partially follows the direction of travel of the motor vehicle.

7. The headlight as claimed in claim 1, wherein
the light output from the corresponding primary optics element is in each case the headlight element output.

8. The headlight as claimed in claim 1, wherein
each primary optics element is followed by an optical waveguide, preferably a glass fiber or a bundle with multiple glass fibers, with a light input surface and a light output surface, in the emission direction of the primary optics, into which at least the majority of the light which is emitted from the light output of the respective primary optics element is passed through the light input surface.

9. The headlight as claimed in claim 8, wherein
the light output surface of the optical waveguide is in each case the headlight element output.

10. The headlight as claimed in claim 8, wherein
the light input surface of each of the optical waveguides is directly adjacent to the light output of the corresponding primary optics element.

11. The headlight as claimed in claim 8, wherein
the optical waveguide is in each case connected by means of a connecting plug to the corresponding primary optics element, and/or in that the optical waveguide is in each case fitted with the light input surface, by means of an adhesive, to the light output of the corresponding primary optics element, and is connected to the primary optics element.

12. The headlight as claimed in claim 8, wherein
the optical waveguide is in each case connected by means of a connecting plug to the corresponding primary optics element, and in that the multitude of connecting plugs are connected to one another, or are formed integrally.

13. The headlight as claimed in claim 8, wherein
the optical waveguide is in each case connected by means of a connecting plug to the corresponding primary optics element, and in that the connecting plug is formed integrally with the primary optics element.

14. The headlight as claimed in claim 8,
wherein the optical waveguide is formed integrally with the corresponding primary optics element.

15. The headlight as claimed in claim 1, wherein
the light input has a light input surface or a light input opening, whose size is less than or equal to twice the chip output area, and is preferably less than or equal to 1.5 times the chip output area.

16. The headlight as claimed in claim 1, wherein
the primary optics element is in each case an optical concentrator, with the light input being the actual concentrator output, so that light passes through this in the opposite direction compared with the normal use of a concentrator for focusing, and is thus not concentrated, but leaves the concentrator through the light output with reduced divergence.

17. The headlight as claimed in claim 16, wherein
the primary optics element is a CPC, CEC or CHC-like concentrator.

18. The headlight as claimed in claim 16, wherein
the concentrator has side walls which connect the light input to the light output and are designed in such a way that direct connecting lines which run on the side walls run essentially in a straight line between the light input and the light output.

19. The headlight as claimed in claim 16, wherein
the concentrator has a cross-sectional surface in the form of a regular polygon, preferably a square cross-sectional surface, in a region on the side of the light input, and in that it likewise has a cross-sectional surface in the form of a regular polygon, preferably a triangular, quadrilateral, hexagonal or octagonal cross-sectional surface, in a region on the side of the light output.

20. The headlight as claimed in claim 16,
wherein
the concentrator has a base body which defines a cavity, whose internal wall is reflective for the light emitted from the semiconductor chip and/or whose internal wall is essentially provided with a layer or layer sequence, preferably with a metallic layer, which is reflective for the light emitted from the semiconductor chip.

21. The headlight as claimed in claim 16,
wherein
the concentrator is a dielectric concentrator, whose base body is a solid body which is composed of a dielectric material with a suitable refractive index such that light which is injected via the light input is reflected in this by total internal reflection on the side boundary surface of the solid body, which connects the light input to the light output, to the external atmosphere.

22. The headlight as claimed in claim 21,
wherein
the light output is a boundary surface of the solid body that is curved like a lens.

23. The headlight as claimed in claim 22,
wherein
the light output is curved in the form of an aspherical lens.

24. The headlight as claimed in claim 23,
wherein
the dielectric concentrator is provided at least partly with a layer or layer sequence, preferably with a metallic layer, which is reflective for the light which is emitted from the respective semiconductor chip.

25. The headlight as claimed in claim 16,
wherein
the concentrator is arranged downstream from the semiconductor chip in its main emission direction, and in that there is a gap between the chip output surface and the light input of the concentrator.

26. The headlight as claimed in claim 25,
wherein
the gap is substantially free of solid or viscous materials.

27. The headlight as claimed in claim 25,
wherein
the headlight element has one or more reflector elements which are arranged in such a way, and/or are of such a shape that some of the light beams which do not pass directly from the semiconductor chip into the concentrator are reflected multiple times on it and are deflected at a smaller angle, measured against the main emission direction of the semiconductor chip, to the light input of the concentrator.

28. The headlight as claimed in claim 19,
wherein
the base body of the concentrator is composed of a transparent glass, a transparent crystal or a transparent plastic, and in that it is preferably manufactured using an injection-molding and/or transfer-molding process.

29. The headlight as claimed in claim 1,
wherein
the semiconductor chip is a diode which emits electromagnetic radiation, preferably a diode which emits electromagnetic radiation and has an at least approximately Lambert emission characteristic, particular preferably being a thin-film light-emitting diode.

30. The headlight as claimed in claim 29,
wherein
the diode is followed in the emission direction by a luminescence conversion material, which converts the wavelength of at least a portion of the electromagnetic radiation emitted from it.

31. The headlight as claimed in claim 1,
wherein
the headlight elements are followed in their main emission direction by secondary optics, by means of which the light emitted from them experiences a further reduction in divergence, and/or is mixed.

32. The headlight as claimed in claim 31,
wherein
the secondary optics are a condensor lens.

33. The headlight as claimed in claim 1,
wherein
the primary optics elements of multiple headlight elements are formed integrally with one another.

34. The headlight as claimed in claim 1,
wherein
the semiconductor chips are arranged on in each case one mount, on which they are in each case surrounded by a frame to or in which the primary optics element is fitted and by which it is held, and/or by which it is adjusted relative to the chip output surface.

35. The headlight as claimed in claim 34,
wherein
at least some of the mounts and/or the mount and the frame in each case are formed integrally.

36. The headlight as claimed in claim 34,
wherein
the mounts of multiple semiconductor diodes are arranged alongside one another, like rows, in at least one row.

37. The headlight as claimed in claim 34, wherein the internal surface of the frame and/or free surfaces of that surface of the mount which faces the emission direction of the headlight
is or are reflective for light which is emitted from the respective semiconductor chip, and/or
is or are at least partially provided with a layer or a layer sequence, preferably with a metallic layer, which is reflective for the light which is emitted from the respective semiconductor chip.

38. A headlight element comprising:
at least one semiconductor chip which emits electromagnetic radiation and has a chip output surface through which electromagnetic radiation is emitted, the semiconductor chip being integrated into the headlight element without a housing;
a primary optics element, which has a light input and a light output and which reduces the divergence of the light which is incident through the light input, with the light being at least a part of the electromagnetic radiation and/or at least a part of a secondary radiation which is produced from the electromagnetic radiation; and
at least one headlight element output, from which a part of the headlight light is emitted from the headlight element;
wherein the primary optics element comprises a CPC, CEC or CHC-like optical concentrator, with the light input being the actual concentrator output, so that light passes through said concentrator in an opposite direction compared with normal use of a concentrator for focusing, and is thus not concentrated, but leaves the concentrator through the light output with reduced divergence.

39. The headlight element as claimed in claim 38, wherein the concentrator has a cross-sectional surface in the form of a regular polygon, preferably a square cross-sectional surface, in a region on the side of the light input, and in that it likewise has a cross-sectional surface in the form of a regular polygon, preferably a triangular, quadrilateral, hexagonal or octagonal cross-sectional surface, in a region on the side of the light output.

40. The headlight element as claimed in claim 38, wherein the concentrator has a base body which defines a cavity, whose internal wall is reflective for the light emitted from the semiconductor chip and/or whose internal wall is essentially provided with a layer or layer sequence, preferably with a metallic layer, which is reflective for the light emitted from the semiconductor chip.

41. The headlight element as claimed in claim 38, wherein the concentrator is a dielectric concentrator, whose base body is a solid body which is composed of a dielectric material with a suitable refractive index such that light which is injected via the light input is reflected in this by total internal reflection on the side boundary surface of the solid body, which connects the light input to the light output, to the external atmosphere.

42. The headlight element as claimed in claim 41, wherein the dielectric concentrator is provided at least partly with a layer or layer sequence, preferably with a metallic layer, which is reflective for the light which is emitted from the respective semiconductor chip.

43. The headlight element as claimed in claim 38, wherein the concentrator is arranged downstream from the semiconductor chip in its main emission direction, and in that there is a gap between the chip output surface and the light input of the concentrator.

44. The headlight element as claimed in claim 43, wherein the gap is substantially free of solid or viscous materials.

45. The headlight element as claimed in claim 43, wherein the headlight element has one or more reflector elements which are arranged in such a way, and/or are of such a shape that the majority of the light beams which do not pass directly from the semiconductor chip into the concentrator are reflected multiple times on it and are deflected at a smaller angle, measured against the main emission direction of the semiconductor chip, to the light input of the concentrator.

46. The headlight element as claimed in claim 38, wherein the base body of the concentrator is composed of a transparent glass, a transparent crystal or a transparent plastic, and in that it is preferably manufactured using an injection-molding and/or transfer-molding process.

47. The headlight element as claimed in claim 38, wherein the light output of the concentrator is the headlight element output.

48. The headlight element as claimed in claim 38, wherein the concentrator is followed by an optical waveguide, preferably a glass fiber or a bundle with multiple glass fibers, with a light input surface and a light output surface, in the emission direction of the primary optics, into which at least the majority of the light which is emitted from the light output of the concentrator is passed through the light input surface.

49. The headlight element as claimed in claim 48, wherein the light output surface of the optical waveguide is the headlight element output.

50. The headlight element as claimed in claim 48, wherein the optical waveguide is formed integrally with the corresponding concentrator.

51. A headlight element, the headlight elements comprising:
at least one semiconductor chip which emits electromagnetic radiation and has a chip output surface through which electromagnetic radiation is emitted;
a primary optics element, which has a light input and a light output and which reduces the divergence of the light which is incident through the light input, with the light being at least a part of the electromagnetic radiation and/or at least part of a secondary radiation which is produced from the electromagnetic radiation, wherein the primary optics element comprises an optical concentrator oriented to reduce the divergence of the light; and
at least one headlight element output from which a part of the light is emitted from the headlight element; wherein
the optical concentrator is a dielectric concentrator, whose base body is a solid body which is composed of a dielectric material, the concentrator having side walls which connect the light input to the light output and are designed in such a way that direct connecting lines which run on the side walls run essentially in a straight line between the light input and the light output; and wherein
the light output of the optical concentrator is a boundary surface of the solid body that is curved like a lens.

* * * * *